Aug. 30, 1960 V. S. GITTENS 2,951,226

SOCKET AND SUPPORT MEANS FOR MOUNTING ELECTRICAL DEVICES

Filed Jan. 2, 1957

INVENTOR.
VICTOR S. GITTENS

BY Carl H. Seymour [signature]

AGENT

1

2,951,226
SOCKET AND SUPPORT MEANS FOR MOUNTING ELECTRICAL DEVICES

Victor S. Gittens, Philadelphia, Pa., assignor to Philco Corporation, Philadelphia, Pa., a corporation of Pennsylvania Filed Jan. 2, 1957, Ser. No. 632,116
2 Claims. (Cl. 339—17)

The invention herein described and claimed relates generally to electrical connection apparatus and pertains more particularly to a novel combination of socket and panel means for mounting electrical devices. Specifically, the invention has to do with means for supporting removable electronic components and for establishing releasable connections between the contact leads of said components and the electrical circuit of electronic equipment, such as radio or television receivers.

While of broader applicability, the invention is particularly useful when embodied in tube sockets adapted for association with a system of conductors of the so-called "printed" circuit type in which conductive strips are provided on a non-conductive mounting panel. In conventional constructions of this kind, electronic components are mounted on one side, usually the top side, of the panel, and the conductive strips are disposed on the other or bottom side of the panel, said strips being arranged in accordance with a predetermined circuit diagram to provide conductive paths between the components. Sockets adapted to receive the contact prongs or pins of a vacuum tube are also mounted on said one or top side of the panel and have soldering lugs passing through the panel for electrical connection with terminal portions of the conductive paths on the underside of the panel. In circuit panel assemblies for compact television and radio receivers, it is necessary that components be closely grouped on panels of limited dimensions. This close grouping of components on panels of restricted size gives rise to assembly problems and difficulties. These problems and difficulties are encountered particularly when it becomes desirable to provide panels with tuning condensers, switches, volume and tone controls, or similar bulky devices, which take up appreciable space and require the use of enlarged panels so as not to obstruct sockets located in the vicinity of such devices.

It is therefore a primary object of this invention to overcome the above noted difficulties and problems by providing an improved mounting arrangement which makes it possible to place components close to each other without interfering with their use.

Another object of the invention is to provide apparatus for connecting contact prongs of an electrical component with electrical circuit means, which apparatus includes a circuit panel and component socket thereon, said socket and panel being constructed and associated in such a manner that the component prongs can be inserted either through passage means in the socket or through passage means in the panel.

It is also an important object of this invention to provide a component mounting socket, the body of which incorporates means whereby the soldering lugs of the socket can be probed through the body while the component is in engagement therewith so as to facilitate testing of the equipment under actual working conditions.

Other advantageous features of the present invention reside in the provision of a mounting socket which can avoid the possibility of improper connections, which can afford stronger and neater panel construction, and which can be adequately protected by the panel against excessive heat during customary dip-soldering operations.

To the above-mentioned general ends, the invention employs a non-conductive socket body which is adapted

2 for mounting on a circuit carrying panel and which has apertured recesses to accommodate conductive elements for establishing electrical connections between contact prongs of an electronic component and terminal areas of circuit conductors on said panel. In a broader aspect of the present invention, each of the mentioned conductive elements has a prong receiving portion and a soldering lug portion. The prong receiving portions are disposed in the socket body and are such that component prongs can be engaged with said portions by insertion through the apertures of the socket body or through the apertures of the panel. The soldering lug portions are such that they can be connected with the terminal areas of the circuit conductors on the panel without obstructing the prong-receiving apertures.

In incorporating the principles of the invention in vacuum tube sockets, the prong receiving portions of the conductive elements are in the general form of sleeves, and the soldering portions of said elements are in the general form of elongated strips extending from said sleeves. These sleeves together with the corresponding apertures in the socket body and panel are arranged to agree with the conventional arrangement of the prongs of the tube and the mentioned strips are constructed to extend from the socket body and to pass through an additional set of apertures in the circuit panel, the latter apertures registering with the terminal areas of the circuit conductors.

The full nature of the invention and the manner in which the hereinbefore mentioned objects and advantageous features of the invention will be more fully understood from the following description taken in conjunction with the accompanying drawing in which.

Figure 2:
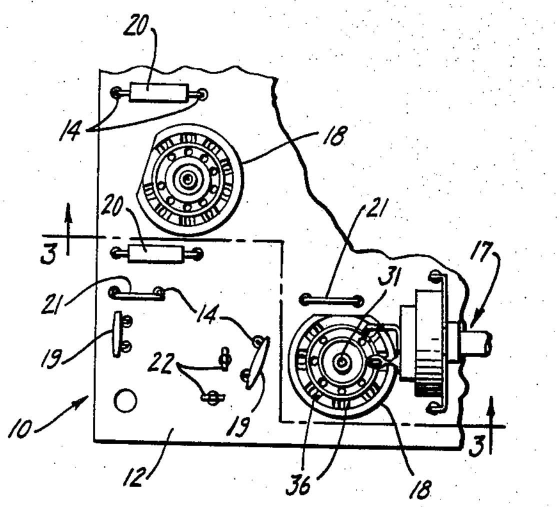
Figure 2 is a top plan view of the panel portion illustrated in Figure 1, the tubes being removed from the mounting sockets.

Having more particular reference to the drawing, there is illustrated a circuit assembly 10, which includes a base in the form of a panel 12 of non-conductive material, such as phenolic plastic or synthetic resin. As shown in Figure 2, perforations 14 for receiving component leads are interspersed throughout the panel in accordance with the predetermined circuit diagram to permit passage of siad leads through the panel and to provide for their connection with circuit conductive paths constituted by means of thin flat conductive strips 15 which are affixed to the normal bottom surface of the panel 12.

Figure 1:
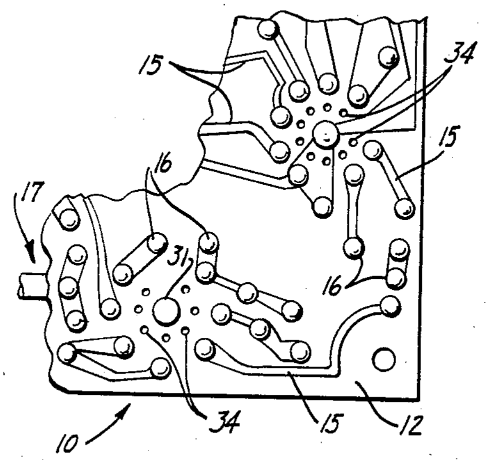
Figure 1 is a bottom plan view of a portion of a circuit panel provided with tube sockets embodying the present invention.

The formation of conductive strips on the mentioned side of the panel is accomplished by any known suitable process, for example by etching, and said strips are made to conform to a predetermined pattern so that they electrically link proper electronic components to complete the circuit. For that purpose, as seen in Figure 1, the conductive strips have portions 16 which register with the lead receiving perforations 14 in the panel 12.

The circuit components overlie the other (normally the top), side of the panel 12 and, in the illustrated example, include such elements as a potentiometer 17, vacuum tube sockets 18, capacitors 19, resistors 20, cross-over linking wires 21, and terminal posts 22. These components, except for the sockets 18, are of conventional types and their leads pass through the appropriate perforations 14 in the panel 12. As is customary, the end portions of the component leads are crimped over for solder connection to the portions 16 of the conductor strips 15.

Figures 3, 4, 5, 6:
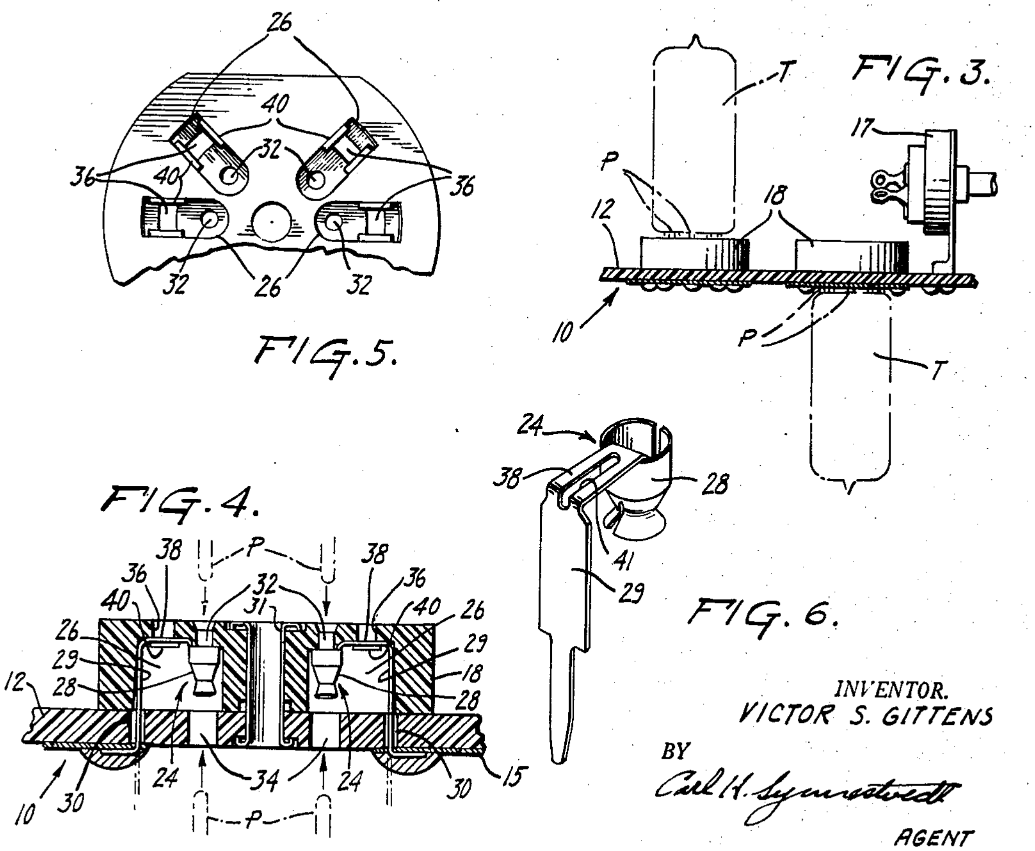
Figure 3 is a cross-sectional view taken substantially on line 3—3 of Figure 2.
Figure 4 is an enlarged cross-sectional view taken through one of the sockets illustrated in Figure 2.
Figure 5 is a fragmentary bottom view of the socket seen in Figure 4, with the conductive elements removed therefrom.
Figure 6 is a perspective view, on a greatly enlarged scale, of a conductive element constructed in accordance with this invention.

In particular accordance with the invention, each of the sockets 18 comprises a non-conductive body or insulation base, which, as shown in Figures 2 and 3, has a thickness which is only a fraction of its diameter. Said body is of generally circular configuration and provided with a plurality of conductive elements designated generally at 24, Figure 4, and which are arranged as a ring, see Figures 2 and 5. As further indicated by Figure 4, these elements serve as contacts for pins P. One of said elements is clearly shown in Figure 6. These conductive elements are seated within radial recesses 26 (Figures 4 and 5) sunk inwardly of the socket body from the normal underside thereof, and each of said elements includes a sleeve-like portion 28 and an angular soldering lug portion 29 extending from one end and disposed to one side of said sleeve-like portion. The lug portions 29 project downwardly from the socket body and are disposed to pass through slots 30 (Fig. 4) in the panel 12 and are bent over for solder connection with certain of the conductive strips 15.

Soldering of the socket lugs as well as of the leads of the various components may be done in any suitable known fashion. However, solder is most conveniently applied by dipping the panel 12 with the various components mounted thereon in a solder path so as to bring the surface of the panel on which the conductive strips 15 and associated lug and lead portions are disposed, in contact with molten solder. In practice, solder is applied only to those points where connections are desired and this result is advantageously obtained by utilizing a mask having open areas located to overlie said points in the manner described and claimed in the co-pending application of Edward W. Plesser and George W. Hanmore, Serial No. 527,274 filed August 9, 1955 and assigned to the assignee of the present application.

As clearly seen in Figure 4 of the drawing, each socket 18 is anchored in proper position on the panel 12 by means of a rivet 31 or like fastening element. In this position, the sleeve-like portions 28 of the conductive elements 24 register with holes 32 in the socket body and with holes 34 in the panel 12, so that vacuum tubes illustrated at T in Figure 3, can be mounted on either side of said panel by introducing the prongs P of the tube either through the holes 32 of the socket or through the holes 34 of the panel, as represented in Figure 4. Because of this arrangement, it will be understood that circuit requirements necessitating placing of a tube socket adjacent a bulky component such as the potentiometer 17, can be satisfied without such component interfering with engagement or disengagement of a vacuum tube with the socket.

As best seen in Figures 4 and 5, the body of each of the sockets 18 is provided with apertures 36 which open from the top of said body into the recesses 26 to give access to a part 38 of the soldering lug portions 29. Testing of a circuit panel mounted on a customary chassis within a cabinet, is facilitated by reason of this construction since probing instruments of test equipment can be applied to portions of the conductive elements 24 from what is normally the top of the panel without removing the chassis from the cabinet. By making the socket body of a size such that the apertures 36 are exposed when a vacuum tube is mounted on the socket, testing of circuits under actual working conditions with vacuum tubes in operation can be advantageously done from said top of the panel. It will further be seen in Figure 4 that part 38 of conductive element 24 constitutes a bridge, connecting the sleeve-like, pin engaging portion 28 with lug or tail 29. The several bridge portions 38 extend in and along the radial recesses 26. As best indicated by Figure 6, sleeve or pin grip portion 28 is of the split sleeve type, being widely open at both ends and convergent therebetween.

In order to hold the connecting elements 24 in proper position within the recesses 26, ledges 40, projecting from the interior walls of said recesses, are disposed to underlie the parts 38 of said conductive elements and to maintain said parts against the floor of said recesses. In practice, the part 38 of each of the conductive elements 24 is reduced in width to clear the ledges 40 when said elements are fitted within the recesses 26. Additionally, the part 39 is slitted as shown at 41 in Figure 6, so that said part, when seated in its recess, can be spread laterally by means of an appropriate tool to overlap the ledges 40 and be thereby locked in position.

From the foregoing description, it will be appreciated that the invention provides a simple socket construction which when mounted on one side of a circuit panel makes it possible to mount vacuum tubes or like components, as well as to effect testing of circuits, from either the so-called printed or copper side (Figure 1) or the so-called insulation side of the panel (Figure 2), as schematically indicated by upper and lower showings of pins P (Figure 4). Although the invention has been shown and described with reference to a specific embodiment, it will be understood that this embodiment is susceptible of variations without departing from the gist of the invention. Accordingly, it is contemplated in the sub-joined claims to cover those changes and modifications which properly come within the spirit and scope of the invention.

What I claim is:

1. Apparatus for connecting contact prongs of an electrical component with associated electrical circuits, comprising: a non-conductive panel, provided with conductive paths having terminal portions disposed within a limited area of said panel, said panel having apertures extending through the panel within said area; a socket insulation base mounted on said panel within said area; and metal contact means secured to said base, such contact means including pin grips and each having a tail, a pair of wide open ends, and a convergent portion between said ends, each pin grip being substantially disposed within the base opposite one of said apertures extending through the panel, the base being apertured to expose both ends of each pin grip and having thickness and arrangement such that the tails project from the base for connection to said conductive paths and that the pin-grips can grip contact pin structure inserted either through said apertures or through the opposite ends of the pin grips.

2. Apparatus as described in claim 1, wherein said socket insulation base is of flat, generally circular shape, said metal contact means are arranged as a ring of contact members which ring is concentric to said base, and said panel apertures are arranged as a ring of generally similar size and form.

References Cited in the file of this patent

UNITED STATES PATENTS

| | | |
|---|---|---|
| 2,028,035 | Anderson | Jan. 14, 1936 |
| 2,149,084 | Cook | Feb. 28, 1939 |
| 2,519,121 | Del Camp | Aug. 15, 1950 |
| 2,567,829 | Suthann | Sept. 11, 1951 |
| 2,760,176 | Del Camp | Aug. 21, 1956 |
| 2,796,593 | Offerman | June 18, 1957 |
| 2,840,793 | Sunko et al. | June 24, 1958 |

FOREIGN PATENTS

| | | |
|---|---|---|
| 173,164 | Switzerland | Feb. 16, 1935 |
| 609,917 | Great Britain | Oct. 8, 1948 |